(12) United States Patent
Kim et al.

(10) Patent No.: US 11,380,753 B2
(45) Date of Patent: Jul. 5, 2022

(54) DISPLAY DEVICE

(71) Applicant: Samsung Display Co., LTD., Yongin-si (KR)

(72) Inventors: Sang Gab Kim, Seoul (KR); Tae Sung Kim, Incheon (KR); Joon Geol Lee, Wanju-gun (KR); Hyun Min Cho, Hwaseong-si (KR); Dae Won Choi, Cheonan-si (KR); Yun Jong Yeo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 203 days.

(21) Appl. No.: 16/899,782

(22) Filed: Jun. 12, 2020

(65) Prior Publication Data
US 2021/0013288 A1 Jan. 14, 2021

(30) Foreign Application Priority Data

Jul. 9, 2019 (KR) .................. 10-2019-0082724

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01)

(58) Field of Classification Search
CPC ............ H01L 27/3276; H01L 51/0097; H01L 2251/558; H01L 51/5253; H01L 51/56; H01L 2251/5338; H01L 27/3246; H01L 27/323; H01L 27/3248; H01L 27/3258; H01L 27/3262; H01L 27/3279; H01L 51/0017; H01L 27/32; H01L 51/0021; H01L 51/5203; Y02E 10/549; Y02P 70/50; G09F 9/301
See application file for complete search history.

(56) References Cited

U.S. PATENT DOCUMENTS

| | | | |
|---|---|---|---|
| 5,510,215 A | 4/1996 | Prince et al. | |
| 5,607,602 A | 3/1997 | Su et al. | |
| 5,843,277 A | 12/1998 | Goto et al. | |

(Continued)

FOREIGN PATENT DOCUMENTS

| | | | |
|---|---|---|---|
| JP | 6132262 A | 5/1994 | |
| KR | 19940024484 A | 11/1994 | |

(Continued)

OTHER PUBLICATIONS

D.Y. Kim et al., "Infinitely high etch selectivity during CH4/H2/Ar inductively coupled plasma (ICP) etching of indium tin oxide (ITO) with photoresist mask," Thin Solid Films, 2008, pp. 3512-3516, vol. 516.

*Primary Examiner* — Kyoung Lee
(74) *Attorney, Agent, or Firm* — Cantor Colburn LLP

(57) ABSTRACT

A display device includes a base substrate; an organic layer disposed on the base substrate; and a first conductive layer disposed on the organic layer, wherein the first conductive layer includes a plurality of stacked films, the plurality of stacked films include a first conductive film disposed directly on the organic layer and a second conductive film disposed on the first conductive film, and the first conductive film has an oxygen concentration higher than an oxygen concentration of the second conductive film.

20 Claims, 16 Drawing Sheets

(56) References Cited

U.S. PATENT DOCUMENTS

| | | |
|---|---|---|
| 6,429,057 B1 | 8/2002 | Hong et al. |
| 6,486,935 B1 | 11/2002 | Hwang et al. |
| 6,623,653 B2 | 9/2003 | Furuta et al. |
| 6,642,074 B2 | 11/2003 | Hong et al. |
| 6,787,809 B2 | 9/2004 | Hong et al. |
| 7,078,255 B2 | 7/2006 | Hong et al. |
| 7,504,290 B2 | 3/2009 | Hong et al. |
| 7,965,752 B1 | 6/2011 | Bhat et al. |
| 8,021,901 B2 | 9/2011 | Kim et al. |
| 9,190,429 B2 | 11/2015 | Cao et al. |
| 9,366,932 B2 | 6/2016 | Chai |
| 9,385,001 B1 | 7/2016 | He et al. |
| 9,472,583 B2 | 10/2016 | Kwon et al. |
| 2010/0117078 A1* | 5/2010 | Kuwabara ......... H01L 29/78696 257/E21.414 |

FOREIGN PATENT DOCUMENTS

| | | |
|---|---|---|
| KR | 100224661 B1 | 10/1999 |
| KR | 100234893 B1 | 12/1999 |
| KR | 100296112 B1 | 7/2001 |
| KR | 20020000953 A | 1/2002 |
| KR | 100408768 B1 | 12/2003 |
| KR | 100417917 B1 | 2/2004 |
| KR | 1020050013045 A | 2/2005 |
| KR | 100482471 B1 | 4/2005 |
| KR | 1020050104151 A | 11/2005 |
| KR | 100558078 B1 | 3/2006 |
| KR | 1020060025211 A | 3/2006 |
| KR | 100660813 B1 | 12/2006 |
| KR | 1020060134491 A | 12/2006 |
| KR | 100697603 B1 | 3/2007 |
| KR | 100700002 B1 | 3/2007 |
| KR | 1020070031970 A | 3/2007 |
| KR | 100707024 B1 | 4/2007 |
| KR | 100721515 B1 | 5/2007 |
| KR | 100776768 B1 | 11/2007 |
| KR | 100850511 B1 | 8/2008 |
| KR | 1020100004598 A | 1/2010 |
| KR | 100987840 B1 | 10/2010 |
| KR | 1020110035733 A | 4/2011 |
| KR | 101041890 B1 | 6/2011 |
| KR | 101107711 B1 | 1/2012 |
| KR | 101127218 B1 | 3/2012 |
| KR | 101215565 B1 | 12/2012 |
| KR | 101217666 B1 | 1/2013 |
| KR | 101221075 B1 | 1/2013 |
| KR | 101231898 B1 | 2/2013 |
| KR | 101248004 B1 | 3/2013 |
| KR | 101251541 B1 | 4/2013 |
| KR | 101294271 B1 | 8/2013 |
| KR | 101294689 B1 | 8/2013 |
| KR | 101356074 B1 | 1/2014 |
| KR | 101389933 B1 | 5/2014 |
| KR | 101471354 B1 | 12/2014 |
| KR | 101611711 B1 | 4/2016 |
| KR | 1020180130613 A | 12/2018 |
| KR | 102017155 B1 | 9/2019 |

* cited by examiner

FIG. 10

| ELEMENT | GASES | COMPOUND | Boiling Point (°C) |
|---|---|---|---|
| In | F | $InF_3$ | 800 °C |
| | Cl | $InCl_3$ | 230 °C |
| | Br | $InBr_3$ | 180 °C |
| | CHx | $(CH_3)_3In$ | 60 °C |

DISPLAY DEVICE

This application claims priority to Korean Patent Application No. 10-2019-0082724, filed on Jul. 9, 2019, and all the benefits accruing therefrom under 35 U.S.C. § 119, the content of which in its entirety is herein incorporated by reference.

BACKGROUND

1. Field

The disclosure relates to a display device, and more specifically, to a display device which is switchable between a folded state and an unfolded state.

2. Description of the Related Art

A display device, which display images, may include a display panel such as an organic light-emitting display panel or a liquid crystal display panel.

A mobile electronic device typically includes a display device to provide an image to a user. A demand of the mobile electronic devices having a larger display screen with a volume or thickness smaller than or equal to that of a conventional mobile electronic device is increasing. A foldable display device or bendable display device, which has a structure that is foldable and unfoldable to provide a larger screen only at the time of use, is also being developed.

SUMMARY

Embodiments of the disclosure relate to a display device in which a loss of an organic film disposed at a lower side is effectively prevented through a process of etching a conductive layer.

According to an embodiment of the disclosure, a display device includes a base substrate; an organic layer disposed on the base substrate; and a first conductive layer disposed on the organic layer, where the first conductive layer includes a plurality of stacked films, the plurality of stacked films include a first conductive film disposed directly on the organic layer and a second conductive film disposed on the first conductive film, and the first conductive film has an oxygen concentration higher than an oxygen concentration of the second conductive film.

In an embodiment, the first conductive film may have an etch rate of about 80 nanometers per minute (nm/min) with respect to a flow rate in a range of about 0.17 to about 0.22 of an organic gas etchant.

In an embodiment, the organic gas etchant may include at least one material selected from a methane gas ($CH_4$), an ethane gas ($C_2H_6$), and an acetic acid ($CH_3COOH$).

In an embodiment, the second conductive layer may include at least one material selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

In an embodiment, the second conductive film may include a first sub-conductive film disposed on the first conductive film and a second sub-conductive film disposed on the first sub-conductive film.

In an embodiment, the first sub-conductive film may include aluminum (Al), and the second sub-conductive film may include titanium (Ti).

In an embodiment, the display device may further include a third conductive film disposed between the first sub-conductive film and the first conductive film, where the third conductive film may have an oxygen concentration lower than the oxygen concentration of the first conductive film.

In an embodiment, the first conductive film may have side surfaces disposed farther inward than side surfaces of the second conductive film, and a distance by which the side surfaces of the first conductive film are recessed farther inward than the side surfaces of the second conductive film may be in a range of about 0.4 micrometer (μm) to about 0.6 μm.

In an embodiment, the display device may further include an inorganic layer disposed below the organic layer and a second conductive layer disposed between the inorganic layer and the organic layer, where the second conductive layer may include a plurality of stacked films, the plurality of stacked films may include a third conductive film disposed between the inorganic layer and the organic layer and disposed directly on an upper surface of the inorganic layer and a fourth conductive film disposed between the third conductive film and the organic layer, and the third conductive film may have an oxygen concentration higher than an oxygen concentration of the fourth conductive film.

In an embodiment, the third conductive film may have an etch rate of about 80 nm/min with respect to a flow rate in a range of about 0.17 to about 0.22 of an organic gas etchant.

According to an embodiment of the disclosure, a method of manufacturing a display device includes providing a conductive layer including a plurality of layers sequentially stacked on an organic layer, where the plurality of layers include a first conductive film provided directly on the organic layer and a second conductive film provided on the first conductive film; etching the second conductive film using a first etchant to form a second conductive pattern; and etching the first conductive film using a second etchant different from the first etchant to form a first conductive pattern.

In an embodiment, the first conductive film may have an oxygen concentration higher than an oxygen concentration of the second conductive film.

In an embodiment, the etching the second conductive film using the first etchant to form the second conductive pattern may include dry-etching the second conductive film using the first etchant to form the second conductive pattern.

In an embodiment, the first etchant may include an inorganic gas etchant, and the inorganic gas etchant may include at least one material selected from a chlorine gas ($Cl_2$) and bromine chloride (HBr).

In an embodiment, the etching the first conductive film using the second etchant different from the first etchant to form the first conductive pattern may include dry-etching the first conductive film using the second etchant different from the first etchant to form the first conductive pattern.

In an embodiment, the second etchant may include an organic gas etchant and, the organic gas etchant may include at least one material selected from a methane gas ($CH_4$), an ethane gas ($C_2H_6$), and an acetic acid ($CH_3COOH$).

In an embodiment, the dry-etching of the first conductive film using the second etchant different from the first etchant to form the first conductive pattern may include dry-etching the first conductive film at an etch rate of about 80 nm/min with respect to a flow rate in a range of about 0.17 to about 0.22 of the organic gas etchant.

In an embodiment, the etching the first conductive film using the second etchant different from the first etchant to form the first conductive pattern may include wet-etching the first conductive film using the second etchant different from the first etchant to form the first conductive pattern.

In an embodiment, The wet-etching the first conductive film using the second etchant different from the first etchant to form the first conductive pattern may include forming an undercut shape in which the first conductive pattern is disposed farther inward than side surfaces of the second conductive pattern.

In an embodiment, in the undercut shape, a distance by which side surfaces of the first conductive film are recessed farther inward than the side surfaces of the second conductive film may be in a range of about 0.4 μm to about 0.6 μm.

BRIEF DESCRIPTION OF THE DRAWINGS

The above and other features of the disclosure will become more apparent by describing exemplary embodiments thereof in detail with reference to the attached drawings, in which:

FIG. 10 is a table showing boiling points of etching gases;

DETAILED DESCRIPTION

Figure 1:
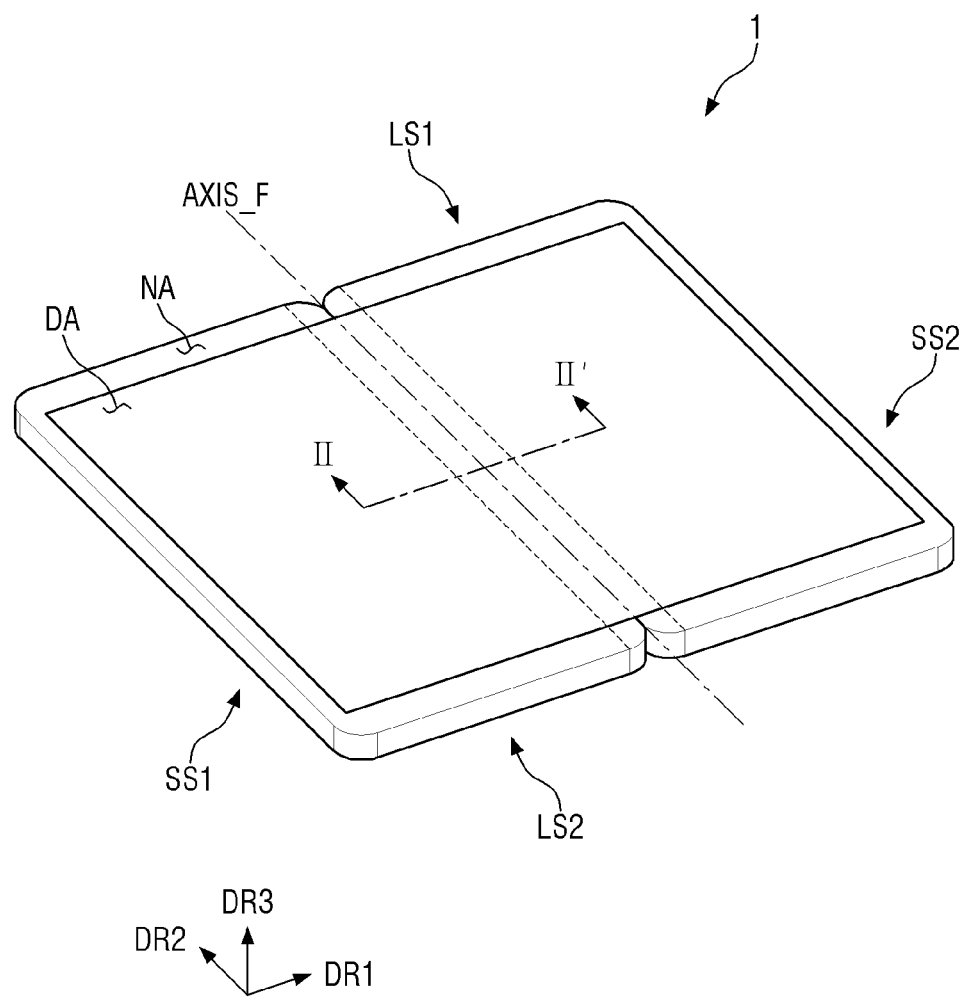
FIG. 1 is a perspective view illustrating a display device according to an exemplary embodiment.

The invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "on" another element or layer, the element or layer can be directly on another element or layer or intervening elements or layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

A display device is a device which displays a still image or a moving image. The display device may be used in a portable electronic device such as a mobile phone, a smartphone, a tablet personal computer ("PC"), a smart watch, a watch phone, a mobile communication terminal, an electronic notebook, an electronic book, a portable multimedia player ("PMP"), a navigation device, an ultra mobile PC ("UMPC") and may also be used as a display screen of various products such as a television, a laptop computer, a monitor, a billboard, and a device for Internet of things ("IoT").

Hereinafter, exemplary embodiments will be described in detail with reference to the accompanying drawings.

Figure 2:
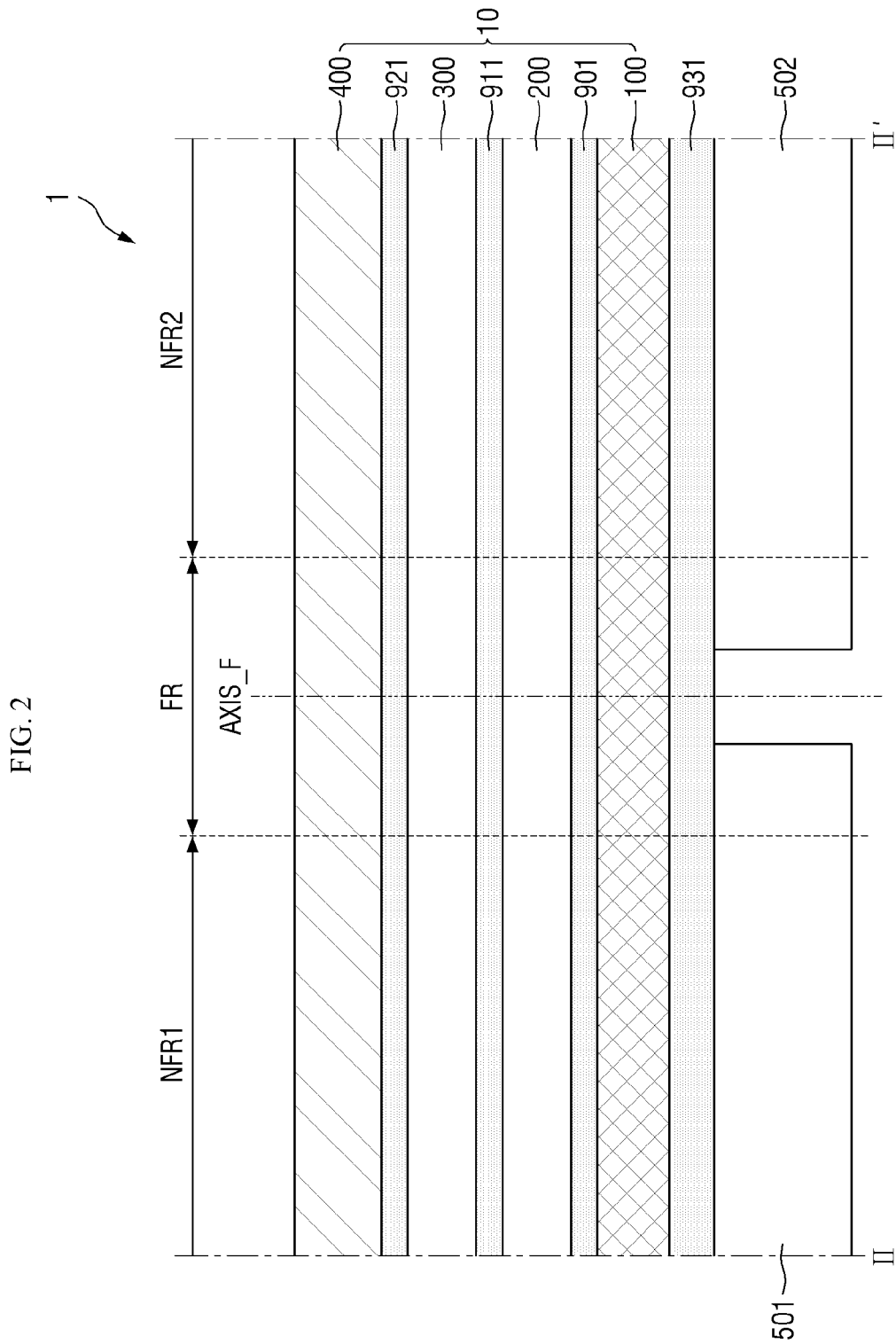
FIG. 2 is a cross-sectional view taken along line II-II' of FIG. 1.
Figure 3:
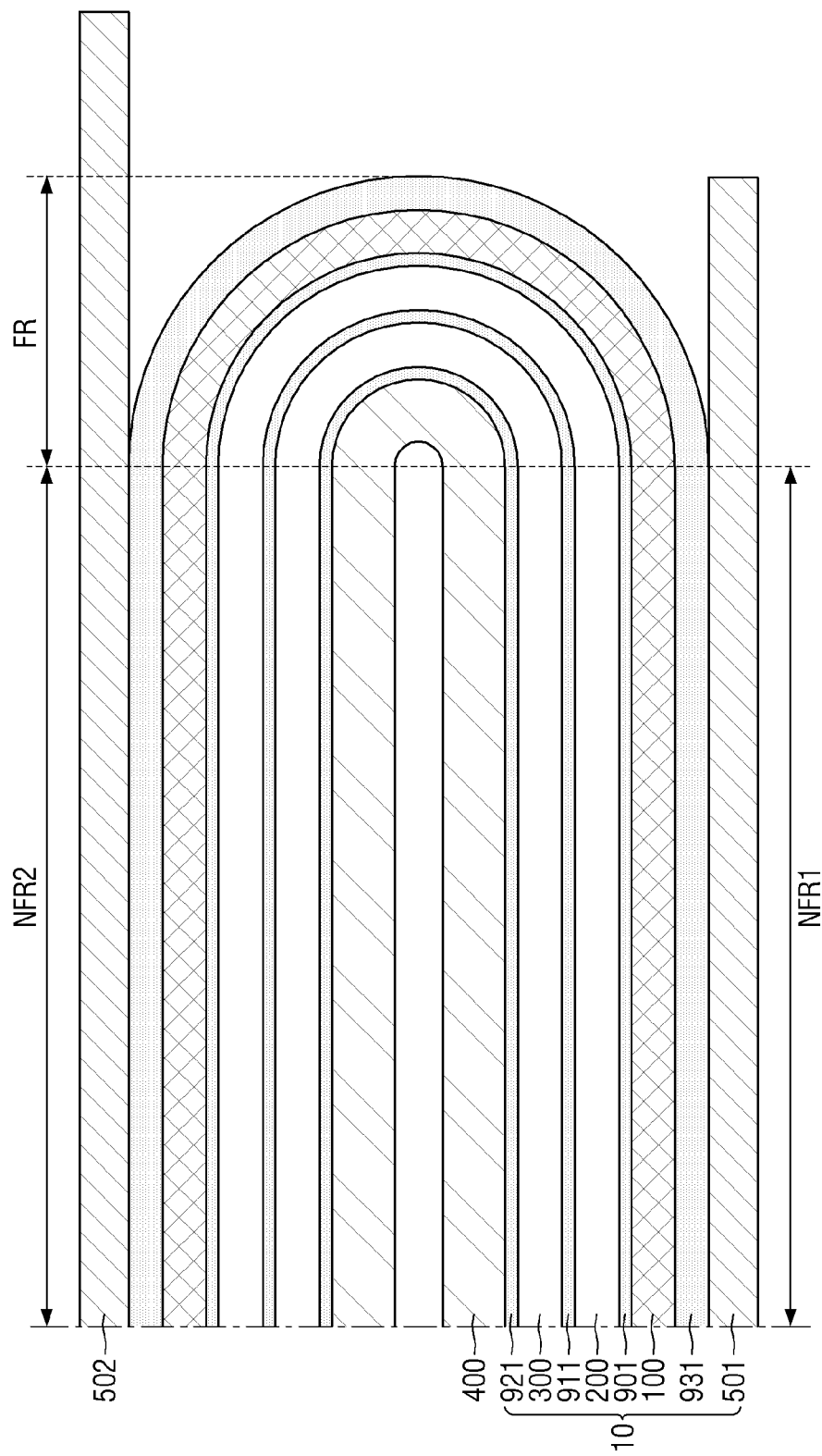
FIG. 3 is a cross-sectional view illustrating the display device in a folded state according to an exemplary embodiment.

FIG. 1 is a perspective view illustrating a display device according to an exemplary embodiment. FIG. 2 is a cross-sectional view taken along line II-II' of FIG. 1. FIG. 3 is a cross-sectional view illustrating the display device in a folded state according to the exemplary embodiment.

Referring to FIGS. 1 to 3, an exemplary embodiment of a display device 1 may be a foldable display device. Herein, the term "foldable" may refer to a foldable state and specifically may be a term referencing the terms "bendable," "rollable," and the like. Furthermore, the term "foldable" should be construed as referencing all of the terms "partially foldable," "fully foldable," "inward-foldable," and "outward-foldable."

In an exemplary embodiment, the display device 1 may include a folding axis AXIS_F that vertically traverses the display device when viewed from a plan view in a thickness direction thereof. The display device 1 may be folded with respect to the folding axis AXIS_F.

The display device 1 may have a substantially rectangular shape in a plan view. The display device may have a rectangular shape of which a corner has a right angle in a plan view or a rectangular shape of which a corner is round in a plan view. The display device may include four edges LS1, LS2, SS1, and SS2. The display device may have long side edges LS1 and LS2 and short side edges SS1 and SS2. In one exemplary embodiment, for example, each of the long side edge LS1 and LS2 may extend in a first direction DR1, and each of the short side edges SS1 and SS2 may extend in a second direction DR2. In the drawings, a third direction DR3 is a direction perpendicular to the first direction DR1 and the second direction DR2, or the thickness direction of the display device 1.

In an exemplary embodiment, as shown in FIG. 1, the folding axis AXIS_F may extend in a direction crossing each of the long sides LS1 and LS2, for example, in the second direction DR2. In such an embodiment, each of the long side edges LS1 and LS2 of the display device 1 may be folded. In an alternative exemplary embodiment, the folding axis AXIS_F may extend to cross each of the short sides SS1 and SS2. In such an embodiment, each of the short side edges SS1 and SS2 of the display device 1 may be folded. Hereinafter, for convenience of description, embodiments in which the folding axis AXIS_F extends to cross the long side edges LS1 and LS2 as shown in FIG. 1. will be mainly described in detail. In an exemplary embodiment, the folding axis AXIS_F may cross a central portion of each of the long side edge LS1 and LS2, but the disclosure is not limited thereto.

Herein, unless otherwise defined, the terms "upper portion" and "upper surface" refer to a display direction, and the terms "lower portion" and "lower surface" refer to a direction opposite to the display direction. In addition, the terms "upper (on)," "lower (below)," "left (left side)," and "right (right side)" refer to a direction when a display surface is disposed in a standard position and viewed from a plan view in the thickness direction.

The display device 1 may include a display region DA and a non-display region NA disposed around the display region DA. The display region DA is a region in which a screen is displayed, and the non-display region NA is a region in which a screen is not displayed. The display region DA may be disposed at a center of the display device 1. In a state in which the display device DA is folded, regions into which the display region DA is divided with respect to the folding axis AXIS_F may overlap each other, and in a state in which the display device 1 is unfolded again, the regions may be unfolded, and thus, a screen may be exposed in the display region DA.

Grooves (for example, notches) recessed downward and upward in the plan view are defined or formed in regions adjacent to a first long side LS1 and a second long side LS2 of the display device 1, which meet the folding axis AXIS_F. A hinge member (not shown) for switching a state may be coupled to a concave portion, but the disclosure is not limited thereto.

Referring to FIG. 2, an exemplary embodiment of the display device 1 may be divided into a folded region FR and non-folded regions NFR1 and NFR2.

In such an embodiment, the display device 1 may include the folded region FR disposed in a central region and including the folding axis AXIS_F, and the non-folded regions NFR1 and NFR2 spaced apart from each other with the folded region FR therebetween.

The folded region FR is a region in which the display device 1 is folded or bent to have a certain curvature in a folding direction, and the non-folded regions NFR1 and NFR2 may be regions which are flat and not folded. The non-folded regions NFR1 and NFR2 may be disposed on flat surfaces that are coplanar with each other. However, the disclosure is not limited thereto, and the non-folded regions NFR1 and NFR2 may be partially bent.

In an exemplary embodiment, as shown in FIG. 2, the display device 1 may include a flexible module 10. The flexible module 10 may include a plurality of stacked members. The flexible module 10 may include a display panel 200, a lower functional member 100 disposed below the display panel 200, an upper functional member 300 disposed above the display panel 200, and a window 400 disposed above the upper functional member 300.

The lower functional member 100 may be disposed on a bottom surface of the flexible module 10. The lower functional member 100 may include a functional layer. The functional layer may be a layer which performs a buffering function, a heat dissipating function, an electromagnetic wave shielding function, a grounding function, a strength reinforcing function, a support function pressure sensing function, a digitizing function, or the like. The lower functional member 100 may be formed as a single layer. However, the disclosure is not limited thereto, and the lower functional member 100 may be formed by stacking different functional layers.

In one exemplary embodiment, for example, the lower functional member 100 may include a buffer member. The buffer member may effectively prevent an impact applied from the outside (for example, in a lower direction of the lower functional member 100) from being transferred to the display panel 200. The buffer member may include or be made of a foam material, for example, polyurethane ("PU"), thermoplastic polyurethane ("TPU"), silicon (Si), or polydimethylacrylamide ("PDMA")

The lower functional member 100 may have light transmittance lower than that of a plurality of members to be described later, which are disposed above the display panel 200. In an exemplary embodiment, upper layers disposed above the display panel 200 may have relatively high light transmittance and thus may transmit light emitted from a display region of the display panel 200 upward. In an exemplary embodiment, the lower functional member 100 may have relatively low light transmittance and thus may block light emitted downward from the display region of the display panel 200.

The display panel 200 may be disposed above the lower functional member 100.

The display panel 200 may display an image in response to an input data signal. In an exemplary embodiment, the display panel 200 may be an organic light-emitting display panel, a liquid crystal display panel, a plasma display panel, an electrophoresis display panel, an electro-wetting display panel, a quantum dot light-emitting display panel, or a micro light-emitting diode ("LED") display panel. Hereinafter, for convenience of description, exemplary embodiments where the display panel 200 is the organic light-emitting display panel will be described in detail, but the invention is not limited thereto.

The display panel 200 may include a flexible substrate including a flexible polymer material such as polyimide ("PI"). Therefore, the display panel 200 may be foldable, bendable, or rollable. The display panel 200 may have a shape substantially similar to a planar shape of the display device 1.

A plurality of pixels PX may be disposed in a display region DA of the display panel 200, and a signal line or a driving circuit for applying a signal to each pixel DA may be disposed in a non-display region NDA. In addition, a black matrix having a rectangular frame shape in a plan view may be disposed in the non-display region NA.

The pixel PX may include a light-emitting layer and a circuit layer configured to control an amount of light emitted from the light-emitting layer. The circuit layer may include a plurality of lines, a plurality of electrodes, and a transistor. In an exemplary embodiment, the light emitting layer may include an organic light-emitting material. The light-emitting layer may be sealed by an encapsulation film. The encapsulation film may seal the light-emitting layer to prevent moisture and the like from being introduced into the light-emitting layer from the outside. The encapsulation film may be formed as a single inorganic film or a multilayer inorganic film, or the encapsulation film may be formed as a stacked film in which an inorganic film and an organic film are alternately stacked one on another.

The detailed sectional shape of the display region DA of the display panel 200 will be described later in greater detail.

The upper functional member 300 may be disposed above the display panel 200.

The upper functional member 300 may include a functional layer. The functional layer may be a layer which performs a touch sensing function, a color filtering function, a color converting function, a polarizing function, an antireflection function, a biometric information recognizing function (for example, a fingerprint recognizing function), or the like. The upper functional member 300 may include, for example, an antireflective member. The functional layer may be a sheet layer composed of a sheet, a film layer made of a film, a thin film layer, a coating layer, a panel, a plate, or the like. The upper functional member 300 may be formed as a single layer of one function. However, the disclosure is not limited thereto, and the upper functional member 300 may be formed by stacking different functional layers.

The window 400 may be disposed above the upper functional member 300.

The window 400 serves to cover and protect the members 100, 200, and 300 disposed below the window 400. The window 400 may include or be made of glass, quartz, or the like. In an exemplary embodiment, a thickness of the window 400 may be less than about 100 micrometers (μm). In such an embodiment, the window 400 is thin, such that stress is reduced when the display device 1 is folded, and a degree of deformation of a structure may be insignificant even when a folded state and an unfolded state are repeated. In an exemplary embodiment, the window 400 may include ultra-thin glass ("UTG").

The flexible module 10 may include a plurality of adhesive films 901, 911, and 921 between the members 100, 200, 300 and 400 to couple the members 100, 200, 300 and 400 to each other. A first adhesive film 901 may be disposed between the lower functional member 100 and the display panel 200 and may couple the lower functional member 100 and the display panel 200 to each other. A second adhesive film 911 may be disposed between the display panel 200 and the upper functional member 300 and may couple the display panel 200 and the upper functional member 300 to each other. A third adhesive film 921 may be disposed between the upper functional member 300 and the window 400 and may couple the upper functional member 300 and the window 400 to each other.

The plurality of adhesive films 901, 911, and 921 may be films having adhesive characteristics on both an upper surface and a lower surface thereof. In one exemplary embodiment, for example, the plurality of adhesive films 901, 911, and 921 may include a pressure sensitive adhesive ("PSA"), an optical clear adhesive ("OCA"), or an optical clear resin ("OCR"). The adhesive films may include an acrylic resin, a silicone resin, or the like. In an exemplary embodiment, the adhesive films may have an elongation rate in a range of about 100% to about 1,000%.

The display device 1 may further include support plates 501 and 502 and a fourth adhesive film 931. The support plates 501 and 502 may be disposed below the display module 10, and the fourth adhesive film may be disposed between the support plates 501 and 502 and the display module 10.

The support plates 501 and 502 may prevent the display panel 200 from being bent by an external force or may reduce a degree of bending (for example, a bending angle or a bending radius of curvature) of the display panel 200. That is, the support plates 501 and 502 may maintain the display panel 200 in a relatively flat state even when an external force is applied.

The support plates 501 and 502 may include a rigid or semi-rigid material. Specifically, the support plates 501 and 502 may include or be made of a metal material such as stainless steel ("SUS") or aluminum, or a polymer such as polymethyl methacrylate ("PMMA"), polycarbonate ("PC"), polyvinyl alcohol ("PVA"), acrylonitrile-butadiene-styrene ("ABS"), or polyethylene terephthalate ("PET"). In one exemplary embodiment, for example, the support plates 501 and 502 may be an SUS film having a thickness in a range from about 200 μm to about 250 μm. In one alternative embodiment, for example, the support plates 501 and 502 may be an aluminum film having a thickness in a range from about 200 μm to about 250 μm.

In an exemplary embodiment, the support plates 501 and 502 may include a first support plate 501 and a second support plate 502 which are spaced apart from each other. The first support plate 501 may be disposed to overlap the first non-folded region NFR1 and a portion of the folded region FR. The second support plate 502 may be disposed to overlap the second non-folded region NFR2 and a portion of the folded region FR. The first support plate 501 and the second support plate 502 may be spaced apart from each other by a predetermined distance with respect to the folding axis AXIS_F. In one exemplary embodiment, for example, the predetermined distance may be about 50 μm or less.

The fourth adhesive film 931 may be disposed on entire surfaces of the non-folded regions NFR1 and NFR2 and the folded region FR. The fourth adhesive film 931 may couple the support plates 501 and 502 and the lower functional member 100. The fourth adhesive film 931 may include or be made of the same material as the above-described adhesive films 901, 911, and 921. In one exemplary embodiment, for example, the fourth adhesive film 931 may include or be made of a PSA, but the disclosure is not limited thereto.

Referring to FIG. 3, the flexible module 10 and the fourth adhesive film 931 may be folded to have a certain curvature by an external force in the folded region FR but may not be substantially folded by the external force in the non-folded regions NFR1 and NFR2. That is, the flexible module 10 and the fourth adhesive film 931 may be disposed on flat surfaces that are coplanar with each other in the non-folded regions NFR1 and NFR2.

When an external force is applied to one side of the display device 1, for example, a right side thereof in a folding direction (upward direction of FIG. 3), the folded region FR may be bent or folded, and the second non-folded region NFR2 may be moved or rotated in the folding direction to overlap or be opposite to the first non-folded region NFR1.

Figure 4:
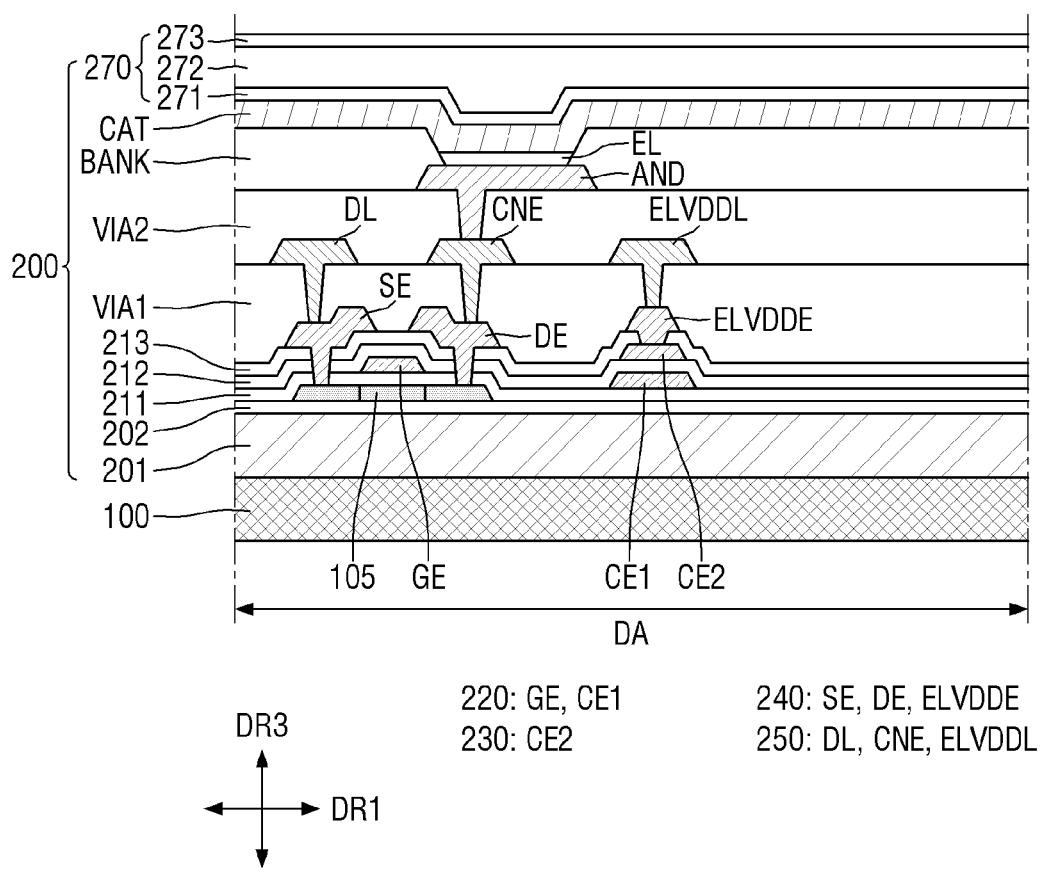
FIG. 4 is a cross-sectional view illustrating the display panel according to an exemplary embodiment.

FIG. 4 is a cross-sectional view illustrating the display panel according to an exemplary embodiment.

Referring to FIG. 4, in an exemplary embodiment, a base substrate 201 may be a flexible substrate including PI or the like as described above. The base substrate 201 is disposed on an entirety of both of the display region DA and the non-display region NA. The base substrate 201 may serve to support various elements disposed thereabove.

A buffer layer 202 may be disposed on or over the base substrate 201. The buffer layer 202 may prevent moisture and oxygen from permeating through the base substrate 201 from the outside. The buffer layer 202 may include at least one material selected from a silicon nitride ($SiN_x$) film, a silicon oxide ($SiO_2$) film, and an oxynitride ($SiO_xN_y$) film.

A semiconductor layer 105 may be disposed on the buffer layer 202. A channel of a thin film transistor is defined in the semiconductor layer 105. The semiconductor layer 105 may be disposed in each pixel of the display region DA. The semiconductor layer 105 may be disposed further in the non-display region NA. The semiconductor layer 105 may include source/drain regions and an active region. The semiconductor layer 105 may include polycrystalline silicon.

A first insulating layer 211 may be disposed on the semiconductor layer 105. The first insulating layer 211 may be disposed on or over an entire surface of the base substrate 201. The first insulating layer 211 may be a gate insulating film having a gate insulating function. The first insulating layer 211 may include a silicon compound, a metal oxide, or the like. In one exemplary embodiment, for example, the first insulating layer 211 may include at least one material selected from silicon oxide, silicon nitride, silicon oxynitride, aluminum oxide, tantalum oxide, hafnium oxide, zirconium oxide, titanium oxide, and a combination thereof.

A first conductive layer 220 may be disposed on the first insulating layer 211. The first conductive layer 220 may include a gate electrode GE of a thin film transistor TFT and a first electrode CE1 of a storage capacitor Cst. The first conductive layer 220 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 220 may be a single film, or a stacked film including or made of a material selected from the above-described materials.

A second insulating layer 212 may be disposed on or over the first conductive layer 220. The second insulating layer 212 may insulate the first conductive layer 220 and a second conductive layer 230 from each other. The second insulating layer 121 may include or be made of a material selected from the above-described materials of the first insulating layer 211.

The second conductive layer 230 may be disposed on the second insulating layer 212. The second conductive layer 230 may include a second electrode CE2 of the storage capacitor Cst. A material of the second conductive layer 230 may be selected from the above-described materials of the first conductive layer 220. A capacitor may be defined by the first electrode CE1 of the storage capacitor Cst and the second electrode CE2 of the storage capacitor Cst through the second insulating layer 212.

A third insulating layer 213 may be disposed on or over the second conductive layer 230. The third insulating layer 213 may include at least one material selected from the above-described materials of the first insulating layer 211. In an exemplary embodiment, the third insulating layer 213 may include or be made of an organic insulating material. In such an embodiment, the organic insulating material may be selected from materials of a first via layer VIA1 to be described below.

A third conductive layer 240 may be disposed on the third insulating layer 213. The third conductive layer 240 may include a source electrode SE, a drain electrode DE, and a high potential voltage electrode ELVDDE. The third conductive layer 240 may include at least one material selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 240 may be a single film made of a material selected from the above-described materials. However, the disclosure is not limited thereto, and alternatively, the third conductive layer 120 may be a stacked film.

The first via layer VIA1 may be disposed on or over the third conductive layer 240. The first via layer VIA1 may include an organic insulating material. The organic insulating material may include at least one material selected from a polyacrylate-based resin, an epoxy resin, a phenolic resin, a polyamide-based resin, a polyimide-based resin, an unsaturated polyester-based resin, a poly phenylenether-based resin, a polyphenylene sulfide-based resin, and benzocyclobutene ("BCB").

A fourth conductive layer 250 may be disposed on the first via layer VIA1 The fourth conductive layer 250 may include a data line DL, a connection electrode CNE, and a high potential voltage line ELVDDL. The data line DL may be electrically connected to the source electrode SE of the thin film transistor TFT through a contact hole defined through the first via layer VIA1 The connection electrode CNE may be electrically connected to the drain electrode DE of the thin film transistor TFT through a contact hole defined through the first via layer VIA1 The high potential voltage line ELVDDL may be electrically connected to the high potential voltage electrode ELVDDE through a contact hole defined through the first via layer VIA1

The fourth conductive layer 250 may include at least one material selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In an exemplary embodiment, the fourth conductive layer 250 may have a multilayer structure. In such an embodiment, the conductive layer 250 may include or be defined by a plurality of stacked films. The structure of the plurality of stacked film of the fourth conductive layer 250 will be described later in greater detail with reference to FIG. 5.

A second via layer VIA2 is disposed on or over the fourth conductive layer 250. The second via layer VIA2 may include at least one material selected from the above-described materials of the first via layer VIA1

An anode electrode AND is disposed on the second via layer VIA2. The anode electrode AND may be electrically connected to the connection electrode CNE through a contact hole defined through the second via layer VIA2.

A bank layer BANK may be disposed on the anode electrode AND. The bank layer BANK may have a contact hole through which the anode electrode AND is exposed. The bank layer BANK may include or be made of an organic insulating material or an inorganic insulating material. In one exemplary embodiment, for example, the bank layer BANK may include or be made of at least one material selected from a photoresist, a polyimide-based resin, an acrylic-based resin, a silicon compound, and a polyacrylic-based resin.

An organic layer EL may be disposed on an upper surface of the anode electrode AND and in an opening of the bank layer BANK. A cathode electrode CAT is disposed on the organic layer EL and the bank layer BANK. The cathode electrode CAT may be a common electrode disposed in a plurality of pixels.

A thin film encapsulation layer 270 is disposed on the cathode electrode CAT. The thin film encapsulation layer 270 may cover an organic light-emitting diode ("OLED"). The thin film encapsulation layer 270 may be a stacked film in which an inorganic film and an organic film are alternately stacked one on another. In one exemplary embodiment, for example, the thin film encapsulation layer 270 may include a first encapsulation inorganic film 271, an encapsulation organic film 272, and a second encapsulation inorganic film 273 which are sequentially stacked one on another.

Figure 5:
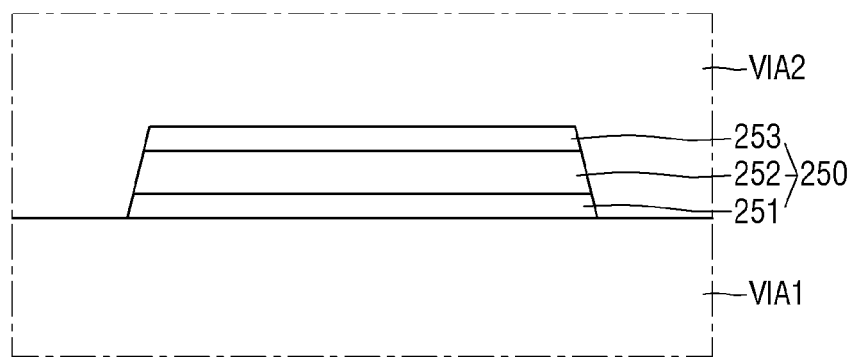
FIG. 5 is a cross-sectional view illustrating a plurality of stacked films of a fourth conductive layer according to the exemplary embodiment.

FIG. 5 is a cross-sectional view illustrating the plurality of stacked films of the fourth conductive layer according to an exemplary embodiment.

Referring to FIG. 5, as described above, the fourth conductive layer 250 includes the plurality of stacked films. The fourth conductive layer 250 includes a first conductive film 251 disposed directly on the first via layer VIA1, a second conductive film 252 disposed on the first conductive film 251, and a third conductive film 253 disposed on the second conductive film 252.

The first conductive film 251 may include or be made of a material having an oxygen concentration higher than those of the second conductive film 252 and the third conductive film 253.

In such an embodiment, the first conductive film 251 is made of the material having the oxygen concentration higher than that of the second conductive film 252 and the third conductive film 253, such that a loss of the first via layer VIA1 may be effectively prevented from occurring when the fourth conductive layer 250 disposed on the first via layer VIA1 is etched. When dry etching is performed, for example, the plurality of conductive films of the fourth conductive layer 250 may be dry-etched all at once. The conductive films at an upper side of the first via layer VIA1 may be easily dry-etched as compared with the conductive film disposed directly on the first via layer VIA1, but the conductive film disposed at a lower side may not be easily etched as compared with the conductive films disposed at the upper side. Furthermore, for example, when the first conductive film disposed directly on the first via layer VIA1 is made of an easily oxidizable material, for example, titanium (Ti), the first conductive film may be easily oxidized. Since a bonding force between atoms constituting the oxidized first conductive film is higher than that of the non-oxidized first conductive film, etching power may be increased to etch the oxidized first conductive film. However, in this case, the first via layer VIA1 disposed below the first conductive film may also be partially lost by dry etching. The structural material of the partially removed first via layer VIA1 may remain in a vibration chamber and cause reliability of a subsequent process to be lowered. In addition, the first via layer VIA1 of which a partial region is lost may become visible spots.

In an exemplary embodiment, since the first conductive film 251 of the fourth conductive layer 250 disposed directly on the first via layer VIA1 has an oxygen concentration higher than those of the second and third conductive films 252 and 253, the first conductive film 251 may be effectively prevented from being easily oxidized, thereby easily etching the first conductive film 251 without increasing etching power. In such an embodiment, since the first conductive film 251 is not easily oxidized, an etch rate may be easily adjusted, thereby performing a more reliable etching process.

In an exemplary embodiment, the first conductive film 251 may include or be made of a material having a high etch rate with respect to an organic gas etchant as described below. In one exemplary embodiment, for example, the first conductive film 251 may include a conductive material having an etch rate of about 70 nanometers per minute (nm/min) with respect to an organic gas etchant having a flow rate in a range of about 0.17 to about 0.22.

In an exemplary embodiment, the first conductive film 251 may include or be made of a transparent conductive oxide, such as indium tin oxide ("ITO"), indium zinc oxide ("IZO"), zinc oxide (ZnO), indium tin zinc oxide ("ITZO"), magnesium oxide (MgO), and indium tin gallium oxide ("ITGO"), for example. The second conductive film 252 may include or be made of aluminum (Al), and the third conductive film 253 may include or be made of titanium (Ti), but the disclosure is not limited thereto.

In an exemplary embodiment, as described below, an etching process of the second conductive film 252 and third conductive film 253 disposed above the first conductive film 251 and an etching process of the first conductive film 251 may be sequentially performed. In such an embodiment, the second and third conductive films 252 and 253 are primarily dry-etched, and the first conductive film 251 may be dry-etched or wet-etched. The etching process of the second conductive film 252 and third conductive film 253 and the etching process of the first conductive film 251 may be performed using different etchants from each other. Typically, the second and third conductive films 252 and 253 may be formed through dry etching, and the first conductive film 251 may be formed through dry etching or wet etching.

Such processes will hereinafter be described in detail with reference to FIGS. 6 to 11.

Figure 6:
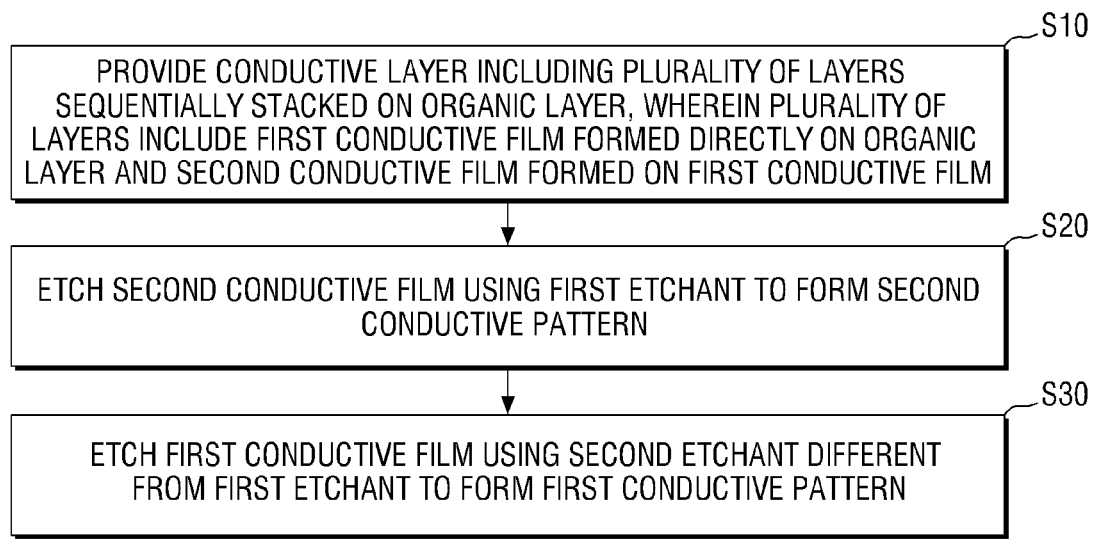
FIG. 6 is a flowchart illustrating a method of manufacturing the display device according to an exemplary embodiment.
Figure 7:
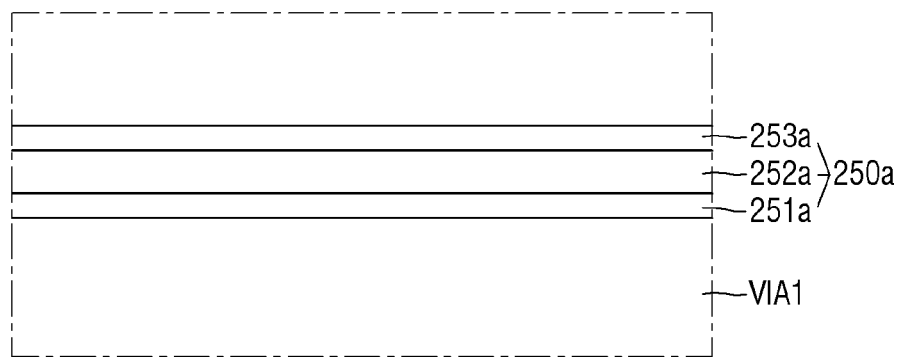
FIGS. 7 to 9 are cross-sectional views illustrating a manufacturing process of the method of manufacturing the display device according to an exemplary embodiment.
Figure 8:
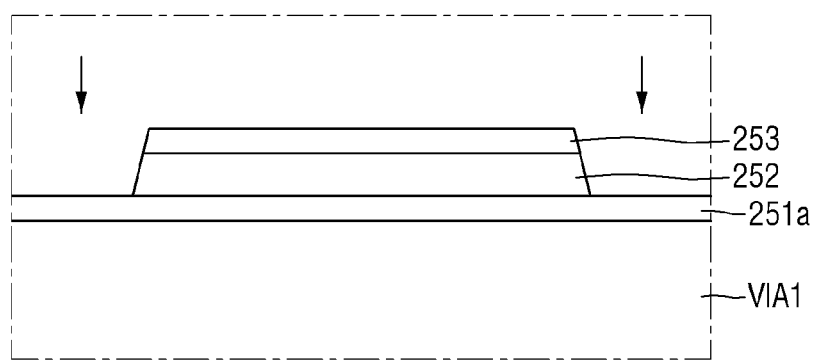
Figure 9:
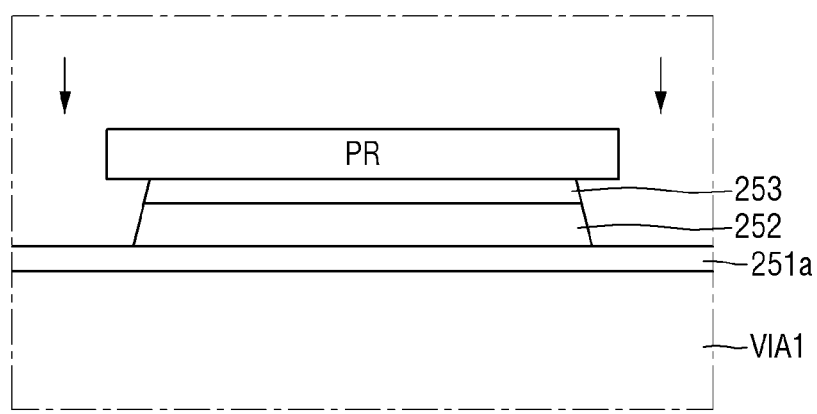
Figure 11:
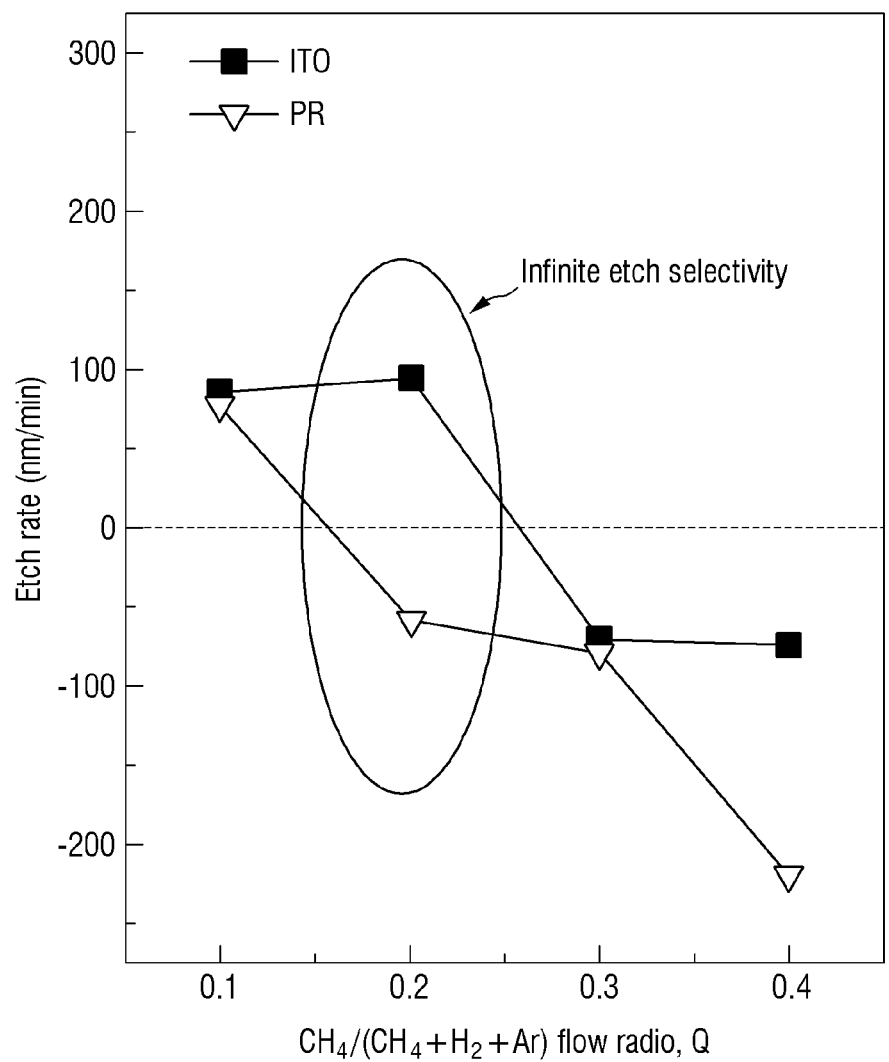
FIG. 11 is a graph showing an etch rate of a first conductive film according to a flow rate of an organic etching gas.

FIG. 6 is a flowchart illustrating a method of manufacturing the display device according to an exemplary embodiment. FIGS. 7 to 9 are cross-sectional views illustrating a manufacturing process of the method of manufacturing the display device according to an exemplary embodiment. FIG. 10 is a table showing boiling points of etching gases. FIG. 11 is a graph showing an etch rate of a first conductive film according to a flow rate of an organic etching gas. More particularly, FIG. 10 shows a boiling point of a first etchant used to dry-etch second conductive films 252a and 253a and a boiling point of a second etchant used to dry-etch a first conductive film 251a, and FIG. 11 shows an etch rate of the first conductive film 251a at a constant flow rate of a material of the second etchant.

Referring to FIGS. 6 and 7, a conductive layer 250a, which includes a plurality of films sequentially stacked on an organic layer VIA1, i.e., the first conductive film 251a directly formed on the organic layer VIA1 and the second conductive films 252a and 253a formed on the first conductive film 251a, is provided (S10).

The material of the first conductive film 251a may be the same as the structural material of the first conductive film 251 described above with reference to FIG. 5. The structural material of a first sub-conductive film 252a may be the same as the structural material of the second conductive film 252 described above with reference to FIG. 5. The structural material of a second sub-conductive film 253a may be the same as the structural material of the third conductive film 253 described above with reference to FIG. 5.

In such an embodiment, the structural material of the first conductive film 251a may include a material having an oxygen concentration higher than those of the structural material of the first sub-conductive film 252a and the structural material of the second sub-conductive film 253a.

In such an embodiment, as described above, since the structural material of the first conductive film 251a includes the material having the oxygen concentration higher than those of the structural material of the first sub-conductive film 252a and the structural material of the second sub-conductive film 253a, a loss of the first via layer VIA1 may be effectively prevented from occurring when the conductive layer 250a disposed on the first via layer VIA1 is etched.

In such an embodiment, the structural material of the first conductive film 251a may include a material having a high etch rate with respect to an organic gas etchant as described above. In one exemplary embodiment, for example, the first conductive film 251a may include a conductive material having an etch rate of about 70 nm/min with respect to an organic gas etchant having a flow rate in a range of about 0.17 to about 0.22.

Referring to FIGS. 6 and 8, the second conductive films 252a and 253a are etched using the first etchant to form second conductive patterns 252 (second conductive film of FIG. 5) and 253 (third conductive film of FIG. 5) (S20).

The etching of the second conductive films 252a and 253a using the first etchant to form the second conductive patterns 252 and 253 may include dry etching the second conductive films 252a and 253a using the first etchant to form the second conductive patterns 252 and 253.

The first etchant may be an inorganic gas. In one exemplary embodiment, the inorganic gas etchant may include a chlorine gas ($Cl_2$), bromine chloride (HBr), or the like, but not being limited thereto.

The first etchant may have a high etch rate with respect to the second conductive films 252a and 253a, but may not have a high etch rate with respect to the first conductive film 251a. That is, the etch rate of the first etchant with respect to the second conductive films 252a and 253a may be much higher than the etch rate of the first etchant with respect to the first conductive film 251a. Therefore, the first conductive film 251a may be barely etched or may not be etched at all during a process of dry-etching the second conductive films 252a and 253a using the first etchant.

Next, referring to FIG. 5 together with FIGS. 6 and 9, the first conductive film 251a is etched using the second etchant different from the first etchant to form a first conductive pattern 251 or the first conductive film 251 of FIG. 5 (S30).

The etching of the first conductive film 251a using the second etchant different from the first etchant to form the first conductive pattern 251 may include dry-etching the first conductive film 251a using the second etchant different from the first etchant to form the first conductive pattern 251.

The second etchant may include an organic gas etchant as described above. In one exemplary embodiment, for example, the organic gas etchant may include a methane gas ($CH_4$), an ethane gas ($C_2H_6$), an acetic acid ($CH_3COOH$), or the like, but not being limited thereto.

The dry-etching of the first conductive film 251a using the second etchant different from the first etchant to form the first conductive pattern 251 may further include forming a photoresist PR on the second conductive patterns 252 and 253 to have a width greater than a width of the second conductive patterns 252 and 253 and dry-etching the first conductive film 251a to form the first conductive pattern 251.

Although not shown in FIGS. 7 to 9, the dry-etching of the first conductive film 251a using the second etchant different from the first etchant to form the first conductive pattern 251 may include wet-etching the first conductive film 251a using the second etchant different from the first etchant to form the first conductive pattern.

The wet-etching of the first conductive film 251a using the second etchant different from the first etchant to form the first conductive pattern may further include forming an undercut shape in which the first conductive pattern 251 is disposed farther inward than side surfaces of the second conductive patterns 252 and 253.

The forming of the undercut shape in which the first conductive pattern 251 is disposed farther inward than the side surfaces of the second conductive patterns 252 and 253 may further include forming the undercut shape such that a distance by which side surfaces of the first conductive pattern 251 are recessed farther inward than the side surfaces of the second conductive patterns 252 and 253 is in a range of about 0.4 μm to about 0.6 μm.

Referring to FIG. 10, FIG. 10 shows that a boiling point of an inorganic gas etchant usable as the first etchant is higher than a boiling point of an organic gas etchant usable as the second etchant.

More specifically, among inorganic gas etchants usable as the first etchant, indium fluoride ($InF_3$) may have a boiling point of about 800° C., indium chloride ($InCl_3$) may have a boiling point of about 800° C., and indium bromide ($InBl_3$) may have a boiling point of about 180° C.

On the other hand, the organic gas etchant usable the second etchant, that is, an indium methyl compound (($CH)_3In$) may have a boiling point of about 60° C.

That is, since the second etchant used during a process of dry-etching the first conductive film 251a has a boiling point lower than that of the first etchant, such that the second etchant remaining after the reaction in the process of dry-etching the first conductive film 251a may be easily removed.

Referring to FIG. 11, FIG. 11 shows that the first conductive film 251a has, for example, an etch rate of about 70 nm/min with respect to an organic gas etchant having a flow rate in a range of about 0.17 to about 0.22. Such features are described above, and any repetitive detailed descriptions thereof will be omitted.

Hereinafter, alternative exemplary embodiments will be described. In the following exemplary embodiments, the same reference numerals will be given to the same or like components as those in the exemplary embodiments described above, and any repetitive detailed description thereof will be omitted or simplified.

Figure 12:
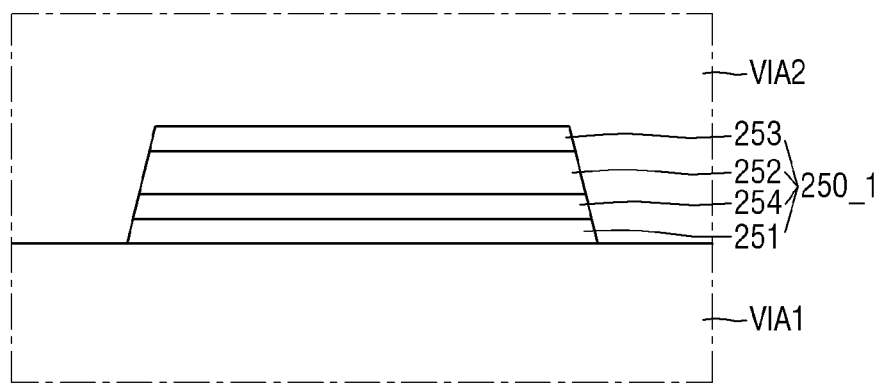
FIG. 12 is a cross-sectional view illustrating a plurality of stacked films of a fourth conductive layer according to an alternative exemplary embodiment

FIG. 12 is a cross-sectional view illustrating a plurality of stacked films of a fourth conductive layer according to an alternative exemplary embodiment.

Referring to FIG. 12, in such an embodiment, a fourth conductive layer 250_1 is substantially the same as the fourth conductive layer 250 described above with reference to FIG. 5 except that a fourth conductive film 254 may be further disposed between a first conductive film 251 and a second conductive film 252.

The fourth conductive film 254 may include at least one material selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

In one exemplary embodiment, for example, the fourth conductive film 254 may include titanium (Ti), but the disclosure is not limited thereto.

In such an embodiment, since the first conductive film 251 of the fourth conductive layer 250_1 disposed directly on a first via layer VIA1 has an oxygen concentration higher than those of second and third conductive films 252 and 253, the first conductive film 251 may be prevented from being easily oxidized, thereby easily etching the first conductive film 251 without increasing etching power. In such an embodiment, since the first conductive film 251 is not easily oxidized, an etch rate may be easily adjusted, thereby performing a more reliable etching process.

Figure 13:
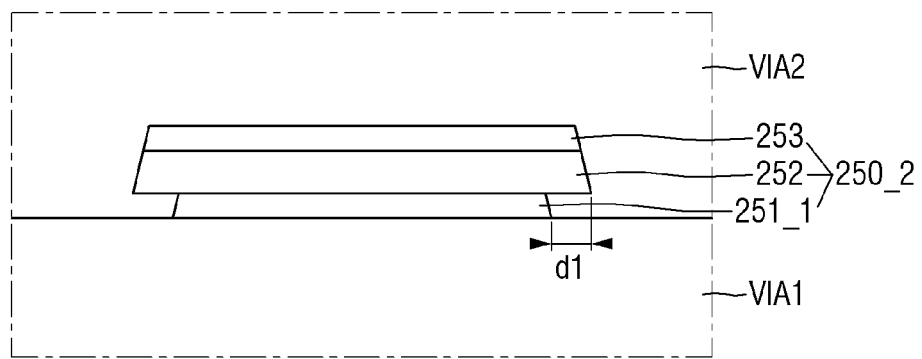
FIG. 13 is a cross-sectional view illustrating a plurality of stacked films of a fourth conductive layer according to another alternative exemplary embodiment.

FIG. 13 is a cross-sectional view illustrating a plurality of stacked films of a fourth conductive layer according to another alternative exemplary embodiment.

Referring to FIG. 13, in such an embodiment, a fourth conductive layer 250_2 is substantially the same as the fourth conductive layer 250 of FIG. 5 except that a first conductive film 251_1 has an undercut shape in which side surfaces thereof are disposed farther inward than side surfaces of a second conductive film 252 and a third conductive film 253 thereabove.

In such an embodiment, the first conductive film 251_1 of the fourth conductive layer 250_2 may have the undercut shape in which the side surfaces thereof are disposed farther inward than the side surfaces of the second conductive film 252 and the third conductive layer film 253 thereabove.

Such a structure may be formed when the first conductive film 251_1 is formed through wet-etching using a third etchant different from the first etchant as described in the method of manufacturing the display device according to an exemplary embodiment. The third etchant may include an acidic material such as a phosphoric acid, a nitric acid, or an acetic acid, but the present disclosure is not limited thereto.

Figure 14:
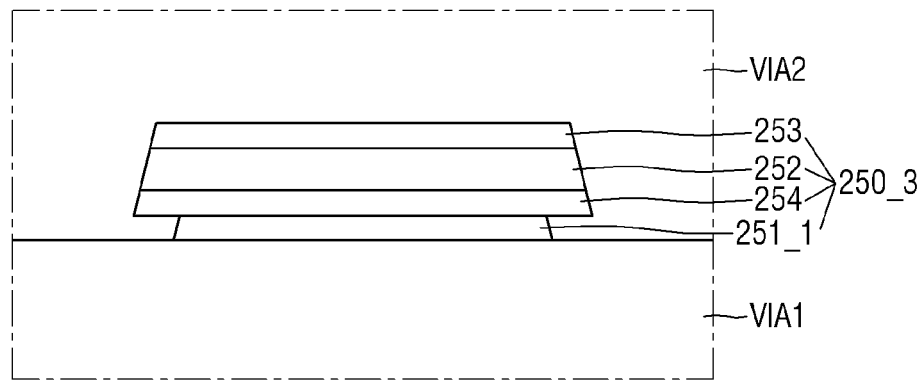
FIG. 14 is a cross-sectional view illustrating a plurality of stacked films of a fourth conductive layer according to still another alternative exemplary embodiment.

A distance dl by which the side surfaces of the first conductive film 251_1 are recessed farther inward than the side surfaces of the second and third conductive films 252 and 253 may be in a range of about 0.4 μm to about 0.6 μm FIG. 14 is a cross-sectional view illustrating a plurality of stacked films of a fourth conductive layer according to another alternative exemplary embodiment.

Referring to FIG. 14, in such an embodiment, a fourth conductive layer 250_3 is substantially the same as that described above with reference to FIG. 13 except that the fourth conductive film 254 of FIG. 12 is further disposed between a first conductive film 251_1 and a second conductive film 252.

In such an embodiment, the fourth conductive film 254 of may be further disposed in the fourth conductive layer 250_3 between the first conductive film 251_1 and the second conductive film 252.

In such an embodiment, other elements are substantially the same as those described above with reference to FIG. 13, and any repetitive detailed description thereof will be omitted.

Figure 15:
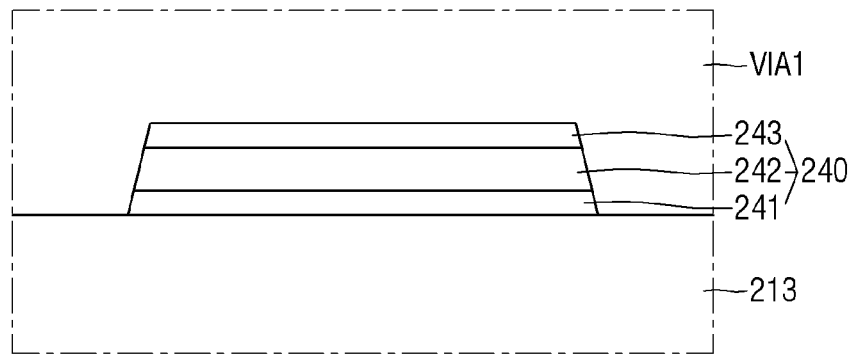
FIG. 15 is a cross-sectional view illustrating a plurality of stacked films of a third conductive layer according to yet another alternative exemplary embodiment.

FIG. 15 is a cross-sectional view illustrating a plurality of stacked films of a third conductive layer according to another alternative exemplary embodiment.

Referring to FIG. 15, in such an embodiment, a third conductive layer 240 is substantially the same as that described above with reference to FIG. 5 except that the third conductive layer 240 has a stacked structure of the fourth conductive layer 250 described with reference to FIG. 5.

In such an embodiment, the third conductive layer 240 includes a plurality of stacked films. The third conductive layer 240 may include a first conductive film 241 disposed directly on a third insulating layer 213, a second conductive film 242 disposed on the first conductive film 241, and a third conductive film 243 disposed on the second conductive film 242.

The first conductive film 241 may include or be made of a material having an oxygen concentration higher than that of the second conductive film 242 and the third conductive film 243.

In such an embodiment, since the first conductive film 241 includes or is made of the material having the oxygen concentration higher than that of the second conductive film 242 and the third conductive film 243, a loss of the third insulating layer 213 may be effectively prevented from occurring when the third conductive layer 240 disposed on the third insulating layer 213 is etched In such an embodiment, the first conductive film 241 may be made of a material having a high etch rate to an organic gas etchant. In one exemplary embodiment, for example, the first conductive film 241 may include a conductive material having an etch rate of about 70 nm/min with respect to an organic gas etchant having a flow rate in a range of about 0.17 to about 0.22.

In such an embodiment, the first conductive layer 241 may include or be made of a transparent conductive oxide, e.g., ITO, IZO, ZnO, ITZO, MgO, ITGO, or ITZO. The second conductive film 242 may include or be made of aluminum (Al), and the third conductive film 243 may be made of titanium (Ti), but the disclosure is not limited thereto.

Figure 16:
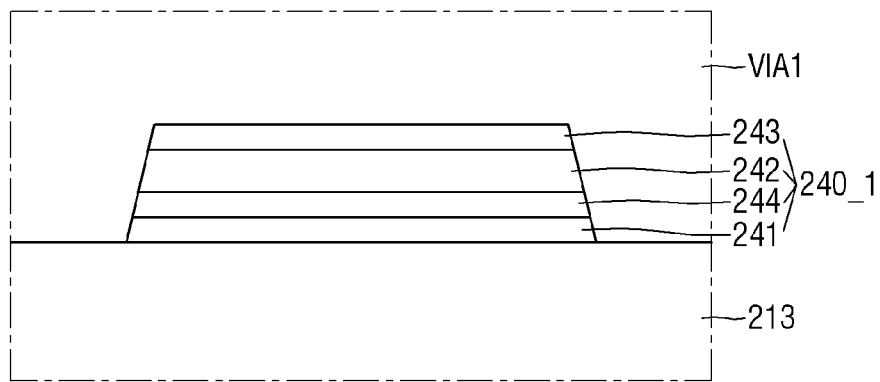
FIG. 16 is a cross-sectional view illustrating a plurality of stacked films of a third conductive layer according to yet another alternative exemplary embodiment.

FIG. 16 is a cross-sectional view illustrating a plurality of stacked films of a third conductive layer according to another alternative exemplary embodiment.

Referring to FIG. 16, in such an embodiment, a third conductive layer 240_1 is substantially the same as that described above with reference to FIG. 12 except that the third conductive layer 240_1 has a stacked structure of the fourth conductive layer 250_1 of FIG. 12, that is, a fourth conductive film 244 may be further disposed between a first conductive film 241 and a second conductive film 242.

In such an embodiment, other elements are substantially the same as those described above with reference to FIG. 12, and any repetitive detailed description thereof will be omitted.

Figure 17:
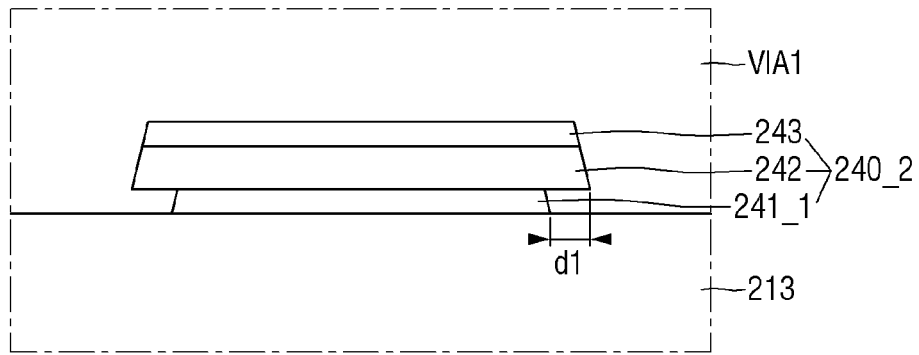
FIG. 17 is a cross-sectional view illustrating a plurality of stacked films of a third conductive layer according to yet another alternative exemplary embodiment.

FIG. 17 is a cross-sectional view illustrating a plurality of stacked films of a third conductive layer according to another alternative exemplary embodiment.

Referring to FIG. 17, in such an embodiment, a third conductive layer 240_2 is substantially the same as that described above with reference to FIG. 13 except that the third conductive layer 240_2 has a stacked structure of the fourth conductive layer 250_2 of FIG. 13, that is, a first conductive film 241_1 has an undercut shape in which side surfaces thereof are disposed farther inward than side surfaces of a second conductive film 242 and a third conductive film 243 thereabove.

In such an embodiment, other elements are substantially the same as those described above with reference to FIG. 13, and any repetitive detailed description thereof will be omitted.

Figure 18:
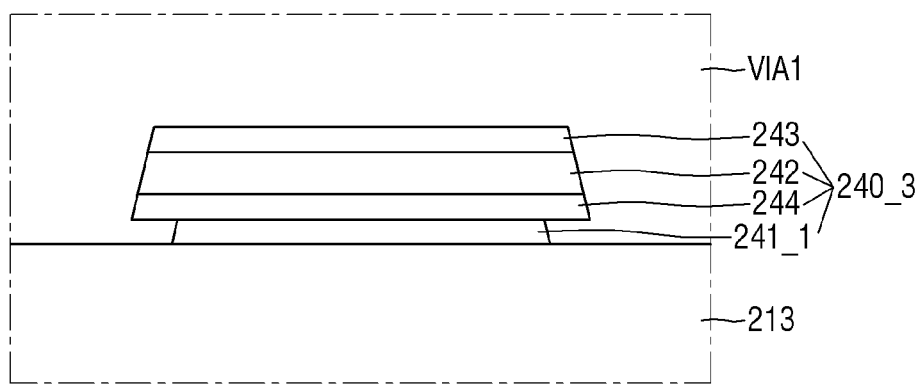
FIG. 18 is a cross-sectional view illustrating a plurality of stacked films of a third conductive layer according to yet another alternative exemplary embodiment.

FIG. 18 is a cross-sectional view illustrating a plurality of stacked films of a third conductive layer according to another alternative exemplary embodiment.

Referring to FIG. 18, in such an embodiment, a third conductive layer 240_3 is substantially the same as that described above with reference to FIG. 14 except that the third conductive layer 240_3 has a stacked structure of the fourth conductive layer 250_3 of FIG. 14.

In such an embodiment, other elements are substantially the same as those described above with reference to FIG. 14, and any repetitive detailed description thereof will be omitted.

According to exemplary embodiments of the invention, a loss of an organic film disposed at a lower side of a conductive layer in a display device in a process of etching the conductive layer is effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a base substrate;
an organic layer disposed on the base substrate; and
a first conductive layer disposed on the organic layer,
wherein the first conductive layer includes a plurality of stacked films,
the plurality of stacked films includes a first conductive film disposed directly on the organic layer and a second conductive film disposed on the first conductive film, and
the first conductive film has an oxygen concentration higher than an oxygen concentration of the second conductive film.

2. The display device of claim 1, wherein the first conductive film has an etch rate of about 80 nm/min with respect to a flow rate in a range of about 0.17 to about 0.22 of an organic gas etchant.

3. The display device of claim 2, wherein the organic gas etchant includes at least one material selected from a methane gas ($CH_4$), an ethane gas ($C_2H_6$), and an acetic acid ($CH_3COOH$).

4. The display device of claim 1, wherein the second conductive film includes at least one material selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

5. The display device of claim 4, wherein the second conductive film includes a first sub-conductive film disposed on the first conductive film and a second sub-conductive film disposed on the first sub-conductive film.

6. The display device of claim 5, wherein
the first sub-conductive film includes aluminum (Al), and
the second sub-conductive film includes titanium (Ti).

7. The display device of claim 5, further comprising:
a third conductive film disposed between the first sub-conductive film and the first conductive film,
wherein the third conductive film has an oxygen concentration lower than the oxygen concentration of the first conductive film.

8. The display device of claim 1, wherein
the first conductive film has side surfaces disposed farther inward than side surfaces of the second conductive film, and
a distance by which the side surfaces of the first conductive film are recessed farther inward than the side surfaces of the second conductive film is in a range of about 0.4 μm to about 0.6 μm.

9. The display device of claim 1, further comprising:
an inorganic layer disposed below the organic layer: and
a second conductive layer disposed between the inorganic layer and the organic layer,
wherein the second conductive layer includes a plurality of stacked films,
the plurality of stacked films include a third conductive film disposed between the inorganic layer and the organic layer and disposed directly on an upper surface of the inorganic layer and a fourth conductive film disposed between the third conductive film and the organic layer, and
the third conductive film has an oxygen concentration higher than an oxygen concentration of the fourth conductive film.

10. The display device of claim 9, wherein the third conductive film has an etch rate of about 80 nm/min with respect to a flow rate in a range of about 0.17 to about 0.22 of an organic gas etchant.

11. A method of manufacturing a display device, the method comprising:
providing a conductive layer including a plurality of layers sequentially stacked on an organic layer, wherein the plurality of layers includes a first conductive film provided directly on the organic layer and a second conductive film provided on the first conductive film;
etching the second conductive film using a first etchant to form a second conductive pattern; and
etching the first conductive film using a second etchant different from the first etchant to form a first conductive pattern.

12. The method of claim 11, wherein, the first conductive film has an oxygen concentration higher than an oxygen concentration of the second conductive film.

13. The method of claim 11, wherein the etching the second conductive film using the first etchant to form the second conductive pattern includes dry-etching the second conductive film using the first etchant to form the second conductive pattern.

14. The method of claim 13, wherein
the first etchant includes an inorganic gas etchant, and
the inorganic gas etchant includes at least one material selected from a chlorine gas ($Cl_2$) and bromine chloride (HBr).

15. The method of claim 13, wherein the etching the first conductive film using the second etchant different from the first etchant to form the first conductive pattern includes dry-etching the first conductive film using the second etchant different from the first etchant to form the first conductive pattern.

16. The method of claim 15, wherein
the second etchant includes an organic gas etchant and,
the organic gas etchant includes at least one material selected from a methane gas ($CH_4$), an ethane gas ($C_2H_6$), and an acetic acid ($CH_3COOH$).

17. The method of claim 16, wherein the thy-etching the first conductive film using the second etchant different from the first etchant to form the first conductive pattern includes dry-etching the first conductive film at an etch rate of about 80 nm/min with respect to a flow rate in a range of about 0.17 to about 0.22 of the organic gas etchant.

18. The method of claim 13, wherein the etching the first conductive film using the second etchant different from the first etchant to form the first conductive pattern includes wet-etching the first conductive film using the second etchant different from the first etchant to form the first conductive pattern.

19. The method of claim 18, wherein the wet-etching the first conductive film using the second etchant different from the first etchant to form the first conductive pattern includes forming an undercut shape in which the first conductive pattern is disposed farther inward than side surfaces of the second conductive pattern.

20. The method of claim 19, wherein, in the undercut shape, a distance by which side surfaces of the first conductive film are recessed farther inward than the side surfaces of the second conductive film is in a range of about 0.4 μm to about 0.6 μm.

* * * * *